United States Patent
Koo et al.

(10) Patent No.: US 7,161,180 B2
(45) Date of Patent: Jan. 9, 2007

(54) FLAT PANEL DISPLAY WITH IMPROVED WHITE BALANCE

(75) Inventors: Jae-Bon Koo, Yongin (KR); Ji-Yong Park, Suwon (KR); Sang-Il Park, Seoul (KR); Deuk-Jong Kim, Seoul (KR); Ul-Ho Lee, Yongin (KR); Jin-Soo Kim, Yongin (KR); Jin-Woung Jung, Suwon (KR); Chang-Gyu Lee, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 148 days.

(21) Appl. No.: 10/823,712

(22) Filed: Apr. 14, 2004

(65) Prior Publication Data

US 2004/0207584 A1    Oct. 21, 2004

(30) Foreign Application Priority Data

Apr. 17, 2003 (KR) ............... 10-2003-0024429
Apr. 17, 2003 (KR) ............... 10-2003-0024503

(51) Int. Cl.
*H01J 29/04* (2006.01)

(52) U.S. Cl. .............. 257/72; 257/64; 257/E29.003; 438/35; 438/166; 313/500; 349/43

(58) Field of Classification Search .......... 438/30, 438/35, 166; 257/59, 64, 89, E31.047, 72, 257/E29.003; 349/43; 313/500
See application file for complete search history.

(56) References Cited

U.S. PATENT DOCUMENTS

| 5,534,716 | A  | * | 7/1996  | Takemura ............. 257/72 |
| 5,614,733 | A  | * | 3/1997  | Zhang et al. .......... 257/66 |
| 6,278,130 | B1 | * | 8/2001  | Joo et al. ............ 257/59 |
| 6,366,025 | B1 | * | 4/2002  | Yamada ............ 315/169.3 |
| 6,838,819 | B1 | * | 1/2005  | Kim et al. ........... 313/505 |
| 6,867,549 | B1 | * | 3/2005  | Cok et al. ......... 315/169.3 |
| 6,891,328 | B1 | * | 5/2005  | Nakamura et al. ..... 313/506 |
| 7,002,647 | B1 | * | 2/2006  | Tanaka ............... 349/107 |
| 2001/0038098 | A1 | * | 11/2001 | Yamazaki et al. ...... 257/72 |
| 2001/0045565 | A1 | * | 11/2001 | Yamazaki ............. 257/89 |

FOREIGN PATENT DOCUMENTS

| JP | 2001-109399     |   | 4/2001  |
| JP | 2001109399 A    | * | 4/2001  |
| JP | 2001-290441     |   | 10/2001 |

* cited by examiner

*Primary Examiner*—Bradley K. Smith
*Assistant Examiner*—Steven J. Fulk
(74) *Attorney, Agent, or Firm*—H.C. Park & Associates, PLC

(57) ABSTRACT

Disclosed is a flat panel display capable of improving a white balance by making channel regions of transistors of R, G and B unit pixels with different current mobilities. The flat panel display includes a plurality of pixels, each of the pixels including R, G and B unit pixels to embody red (R), green (G) and blue (B) colors, respectively, and each of the unit pixels including at least one transistor. Channel layers of the transistors of at least two unit pixels among the R, G and B unit pixels have different current mobilities from one another. The R, G, B unit pixels includes transistors and the transistor of at least one unit pixel among the R, G and B unit pixels includes the channel layer made of silicon layers of different film qualities.

17 Claims, 10 Drawing Sheets

FLAT PANEL DISPLAY WITH IMPROVED WHITE BALANCE

CROSS-REFERENCE TO RELATED APPLICATION

This application claims the benefit of Korean Patent Application No. 2003-24503 and 2003-24429, filed Apr. 17, 2003, the disclosure of which is incorporated herein by reference in its entirety.

FIELD OF THE INVENTION

The present invention is related to a full color flat panel display and, more particularly, to a flat panel display and a method for manufacturing the same, capable of embodying a white balance by making a channel layer of a driving transistor in each of R, G and B unit pixels have different current mobilities using MIC/MILC processes.

BACKGROUND OF THE INVENTION

Generally, as shown in FIG. 1, an organic light emitting diode (OLED) of a flat panel display includes a plurality of pixels 100 which are arranged in the form of matrix. Each pixel 100 consists of three unit pixels, that is, a unit pixel 110R for embodying a red (R), a unit pixel 120G for embodying a green (G) and a unit pixel 130B for embodying a blue (B).

The R unit pixel 110R includes a red electroluminescence (EL) device 115 including a red (R) light emitting layer, a driving transistor 113 for supplying a current to the red EL device 115, and a switching transistor 111 for switching the current supply from the driving transistor 113 to the red EL device 115.

The G unit pixel 120G includes a green EL device 125 including a green (G) light emitting layer, a driving transistor 123 for supplying a current to the green EL device 125, and a switching transistor 121 for switching the current supply from the driving transistor 123 to the green EL device 125.

The B unit pixel 130B include a blue EL device 135 including a blue (B) light emitting layer, a driving transistor 133 for supplying a current to the blue EL device 135, and a switching transistor 131 for switching the current supply from the driving transistor 133 to the blue EL device 135.

Conventionally, the driving transistors 113, 123 and 133 of the R, G and B unit pixels 110R, 120G and 130B of an OLED have the same size, that is, the same ratio W/L of the width W to the length L of the channel layer, and the order of the EL devices in the order of their luminous efficiency is B, R and G unit pixels. In the conventional OLED, since the sizes of the channel layers of the driving transistors 113, 123 and 133 in the R, G, and B unit pixels 110R, 120G and 130B are same while the luminous efficiencies of R, G and B EL devices 115, 125 and 135 are different from one another, it was difficult to embody the white balance.

In order to embody the white balance, a relatively small quantity of current should be supplied to the EL device having high luminous efficiency, for example, the green EL device, and a relatively large quantity of current should be supplied to the red and blue EL devices having lower luminous efficiencies.

Here, since a current Id flowing to the El device through the driving transistor begins to flow when the driving transistor is in the saturation state, the current is expressed as follows.

$$Id = Cox\mu W(Vg-Vth)^2/2L \quad (1)$$

Therefore, one of the methods for controlling the current flowing to the EL device in order to embody the white balance is to make the size of the driving transistors of the R, G and B unit pixels, that is, the ratio W/L of the width W to the length L of the channel layer different and then to control the quantity of the current flowing to the EL devices of the R, G and B unit pixels. The method for controlling the quantity of current flowing to the EL device in accordance with the size of the transistor is disclosed in the Japanese Laid-open Patent Publication No. 2001-109399. In this Japanese patent, sizes of the driving transistors of the R, G and B unit pixels are formed differently in accordance with the luminous efficiencies of the EL device in each of the R, G and B unit pixels. That is, the quantity of the current flowing to the EL device of the R, G and B unit pixels is controlled by making the size of the driving transistor of the unit pixel to embody the green (G) having a higher luminous efficiency smaller than that of the driving transistor of the unit pixel to embody the red (R) or blue (B) having a relatively lower luminous efficiency.

Another method to embody the white balance is to make the dimensions of the light emitting layers of R, G and B unit pixels different, which is disclosed in the Japanese Laid-open Patent Publication No. 2001-290441. In the Japanese patent, same luminance is generated from the R, G and B unit pixels by making the light emitting areas different in accordance with luminous efficiencies of the EL devices of the R, G and B unit pixels. That is, same luminance is generated from the R, G and B unit pixels by making light emitting areas of the R or B unit pixel having low luminous efficiencies larger than the G unit pixel having high luminous efficiency, relatively.

However, in the conventional method for embodying the white balance described above, the light emitting area of the unit pixel having low luminous efficiency among the R, G and B unit pixels is made larger, or increasing the size of the transistor of the unit pixel having low luminous efficiency among the R, G and B unit pixels. There occurs a problem that the area charged in each pixel is increased, and therefore it is not easy to apply the method to a high definition display.

SUMMARY OF THE INVENTION

It is an aspect of the present invention to provide a flat panel display and a method for manufacturing the same wherein a white balance may be embodied without increasing the area of a pixel.

Another aspect of the present invention provides a flat panel display and a method for manufacturing the same wherein a white balance may be embodied by making channel layers of a driving transistors in R, G and B unit pixel have different current mobilities.

It is yet a further aspect of the present invention to provide a flat panel display and a method for manufacturing the same wherein a white balance may be embodied by making channel layers of driving transistors in R, G and B unit pixels have different directions of crystallization.

Yet another aspect of the present invention provides a flat panel display and a method for manufacturing the same wherein a white balance may be embodied by making resistance values of channel layers of driving transistors in R, G and B unit pixels different.

Yet another aspect of the present invention provides a flat panel display and a method for manufacturing the same wherein a white balance may be embodied by making a length of an amorphous silicon film included in the channel layer of the driving transistor in each R, G and B unit pixel different.

According to an exemplary embodiment of the present invention, there is provided a flat panel display comprising a plurality of pixels, where each of the pixels includes R, G and B unit pixels to embody red (R), green (G) and blue (B) colors, respectively, and where each of the unit pixels includes at least one transistor, wherein transistors of at least two unit pixels of the R, G, and B unit pixels include channel layers of different current mobilities.

The at least one transistor of the R, G and B unit pixels includes a channel layer having the same size in each pixel. The R, G and B unit pixels include light-emitting devices, respectively. Transistors to control currents supplied to the light emitting devices of each unit pixel include channel layers having the same size in each pixel, and current mobility of a transistor to drive a light-emitting device having the highest luminous efficiency among the lighting emitting devices of the unit pixels is lower than the current mobility of a transistor to drive light-emitting devices having a relatively lower luminous efficiency.

The channel layers of the transistors of the R, G and B unit pixels may be made of polycrystalline silicon films having different crystallization directions from one another. A channel layer of a transistor to drive a light-emitting device having the highest luminous efficiency among the light-emitting devices may be made of a metal induced crystallization (MIC) polycrystalline silicon film, and channel layers of transistors to drive light-emitting devices having a relatively low luminous efficiency may be made of a metal inducted lateral crystallization (MILC) polycrystalline silicon film.

The R, G and B unit pixels may further include light-emitting devices driven by the transistors respectively, and the R, G and B unit pixels each include a driving transistor to drive the light-emitting device and a switching transistor to switch the driving transistor on or off.

The channel layers of the switching transistors of the R, G and B unit pixels may be made of a MIC polycrystalline silicon film. A driving transistor of a unit pixel having the highest luminous efficiency among the R, G and B unit pixels has a channel layer made of the MIC polycrystalline silicon film, and the driving transistors of unit pixels having a relatively low luminous efficiency have channel layers made of a MILC polycrystalline silicon film.

The channel layers of the switching transistors of the R, G and B unit pixels may be made of a MILC polycrystalline silicon film, and a driving transistor having the highest luminous efficiency among the R, G and B unit pixels may be a channel layer made of a MIC polycrystalline silicon film, while driving transistors of unit pixels having relatively low luminous efficiency may have channel layers made of a MILC polycrystalline silicon film.

A switching transistor and a driving transistor of a unit pixel having the highest luminous efficiency among the R, G and B unit pixels may have channel layers made of a MIC polycrystalline silicon film, and driving transistors and switching transistors of unit pixels having a relatively low luminous efficiency may have channel layers made of a MILC polycrystalline silicon film.

Also, in a flat panel display which comprises a plurality of pixels, each of the pixels including R, G and B unit pixels, and each of the unit pixels including at least one transistor, there is provided a method for manufacturing the flat panel display, comprising forming an amorphous silicon film on an insulating substrate and forming a first and a second MILC masks on the amorphous silicon film. The method further comprises depositing a metal film for MILC over the substrate, crystallizing the amorphous silicon film into a polycrystalline silicon film in order that a portion corresponding to the first and second masks is crystallized by a MILC method and a remaining portion is crystallized by a MIC method, removing the first and second masks and the metal film, and patterning the polycrystalline silicon film in order that a semiconductor layer of a transistor of a unit pixel having the highest luminous efficiency among the R, G and B unit pixels is made of the polycrystalline silicon film crystallized by the MIC method, and semiconductor layers of transistors of unit pixels having the relatively low luminous efficiency is made of the polycrystalline silicon film crystallized by the MILC method.

Also, there is provided a flat panel display, comprising a plurality of pixels, each of the pixels including R, G and B unit pixels to embody red (R), green (G) and blue (B) colors, respectively, each of the unit pixels including a transistor, wherein the transistor of at least one unit pixel among the R, G and B unit pixels includes a channel region made of silicon layers having different film quality.

The transistors of the at least two unit pixels among the R, G and B unit pixels include channel regions made of silicon layers of at least one different film quality, and lengths of the silicon layers having a low current mobility are different in the channel regions.

The R, G and B unit pixels include light-emitting devices, respectively, and a channel region of a transistor corresponding to a light-emitting device having the lowest luminous efficiency among the light-emitting devices of the R, G and B unit pixels does not include the silicon layer having a low current mobility or includes the silicon layer having low current mobility which has a smaller length than channel regions of transistors corresponding to light-emitting devices having relatively luminous efficiency.

The channel region is made of a polycrystalline silicon layer and an amorphous silicon layer and the silicon layer having the low current mobility in the channel region is made of the amorphous silicon layer.

Also, in a flat panel display which comprises a plurality of pixels, each of the pixels including R, G and B unit pixels to embody red (R), green (G) and blue (B) colors, respectively, each of the unit pixels including a transistor, unit pixels, and each unit pixel comprises a transistor, there is provided a method for manufacturing the flat panel display, comprising forming an amorphous silicon film on an insulating substrate forming a first to a third masks for MILC on the amorphous silicon film and depositing a metal film for MILC over the substrate. The method further comprises crystallizing the amorphous silicon film into a polycrystalline silicon film in order that the amorphous silicon film only partially remains under the first to third masks removing the first to third masks for MILC and the metal film for MILC, and patterning the polycrystalline silicon film in order that the amorphous silicon film existing between the polycrystalline silicon films forms semiconductor layers on the transistors of the R, G and B unit pixels, wherein channel regions of the transistors of the R, G and B unit pixels have resistance values determined by the length of the amorphous silicon film existing between the polycrystalline silicon films.

BRIEF DESCRIPTION OF THE DRAWINGS

The above and other features and advantages of the present invention will become more apparent to those of ordinary skill in the art by describing in detail embodiments thereof with reference to the attached drawings.

DETAILED DESCRIPTION OF THE INVENTION

Figure 1:
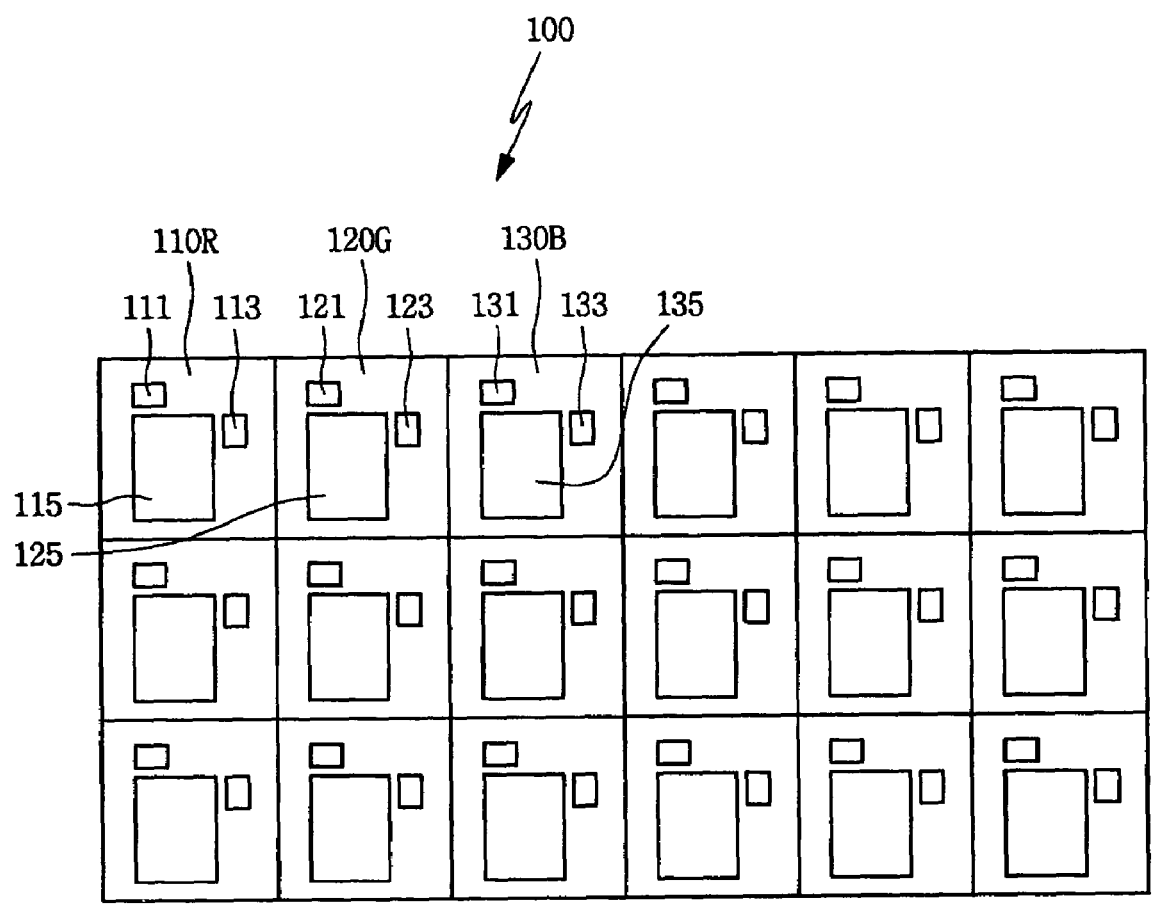
FIG. 1 is a view showing an arrangement of R, G and B unit pixels of a conventional flat panel display.

The present invention will now be described more fully hereinafter with reference to the accompanying drawings, in which embodiments of the invention are shown. This invention may, however, be embodied in different forms and should not be construed as limited to the embodiments set fourth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout the specification.

FIGS. 2A, 2B, 2C, and 2D are views showing a method of manufacturing driving transistors of R, G and B unit pixels in accordance with an embodiment of the present invention. Sectional structures of FIGS. 2A, 2B, 2C and 2D illustrate the driving transistors among the R, G and B unit pixels of each pixel in an organic light emitting diode.

Figure 2A:
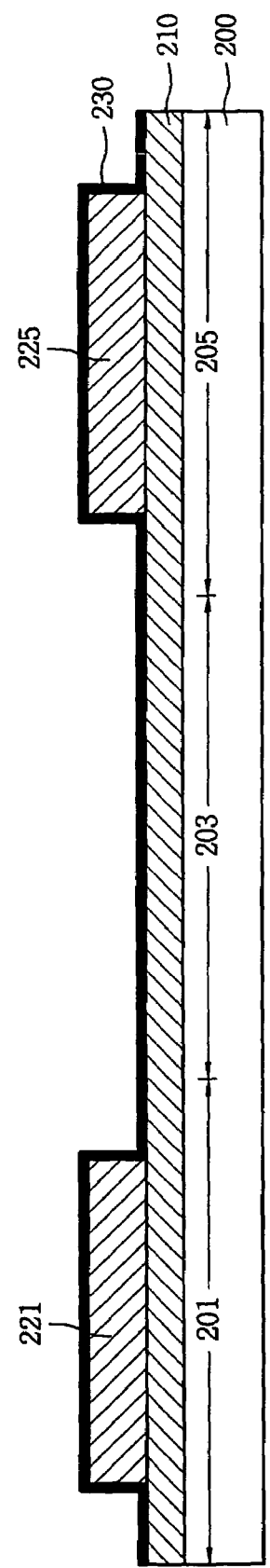
FIGS. 2A, 2B, 2C and 2D are views showing a method for manufacturing driving transistors of R, G and B unit pixels in accordance with an embodiment of the present invention.

Referring to FIG. 2A, a buffer layer which is not shown in the drawing, is formed on an insulating substrate 200, and an amorphous silicon film 210 is formed on the buffer layer. A number of masks 221 and 225 for MILC are formed on the amorphous silicon film 210, and a metal film 230 is formed on the entire surface of the substrate.

The masks 221 and 225 for MILC are formed on regions 201 and 205 where the R and B unit pixels are to be formed correspondingly. Since a mask for the MILC is not formed on a region 203 where G unit pixel is to be formed, the metal film 230 is formed to contact with the amorphous silicon film 210 directly. Although oxide films are used as the masks 221 and 225 for MILC in the present invention, other films such as a photosensitive film may be used instead of the oxide film.

Figure 2B:
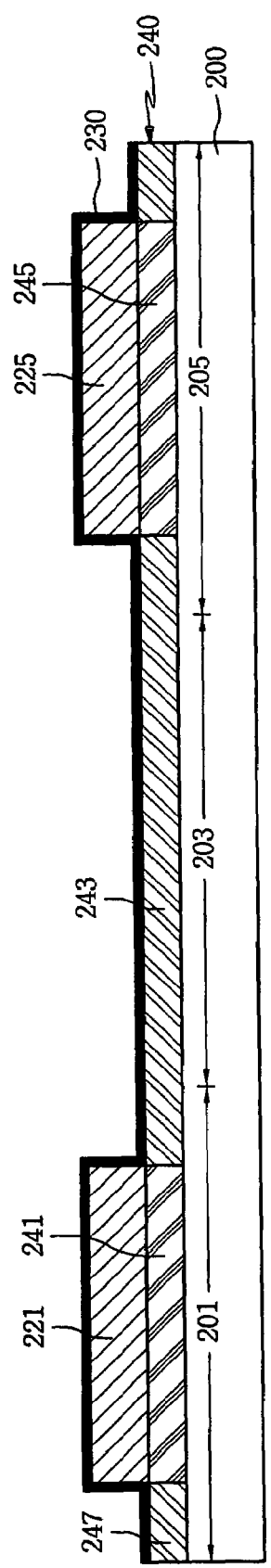

Referring to FIG. 2B, the amorphous silicon film 210 is crystallized as a polycrystalline silicon film 240 by performing a crystallization process. Here, the polycrystalline silicon film 240 is crystallized by the MIC and MILC methods, wherein a portion 241 of the polycrystalline silicon film 240 corresponding to the mask 221 is crystallized by the MILC method, and a portion 245 corresponding to the mask 225 is also crystallized by the MILC method. A portion 243 directly in contact with the metal film 230, that is, the remaining portion 243 including the region 203 where the G unit pixel is to be formed, is entirely crystallized by the MIC method.

Figure 2C:
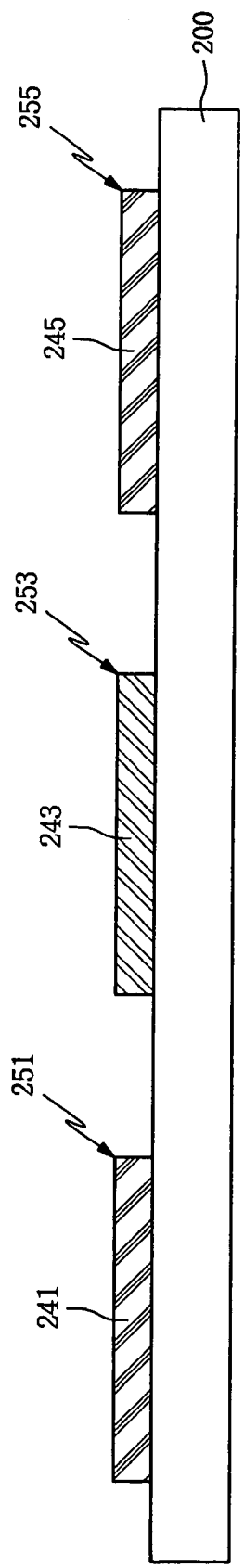

Referring to FIG. 2C, after the masks 221 and 225 for MILC and the metal layer 230 are removed, semiconductor layers 251, 253 and 255 of the driving transistors of the R, G and B unit pixels are formed by patterning the poly silicon film 240 using a mask (not shown in the drawing) for forming the semiconductor layers of the driving transistors. Here, the semiconductor layers 251, 253 and 255 of the driving transistors of the unit pixels are all of the same size.

The semiconductor layer 251 of the driving transistor of the R unit pixel among the R, G and B unit pixels is formed of the poly silicon film 241 crystallized by the MILC method. The semiconductor layer 253 of the driving transistor of the G unit pixel is formed of the poly silicon film 243 crystallized by the MIC method The semiconductor layer 255 of the driving transistor of the B unit pixel is formed of the poly silicon film 245 crystallized by the MILC method.

Figure 2D:
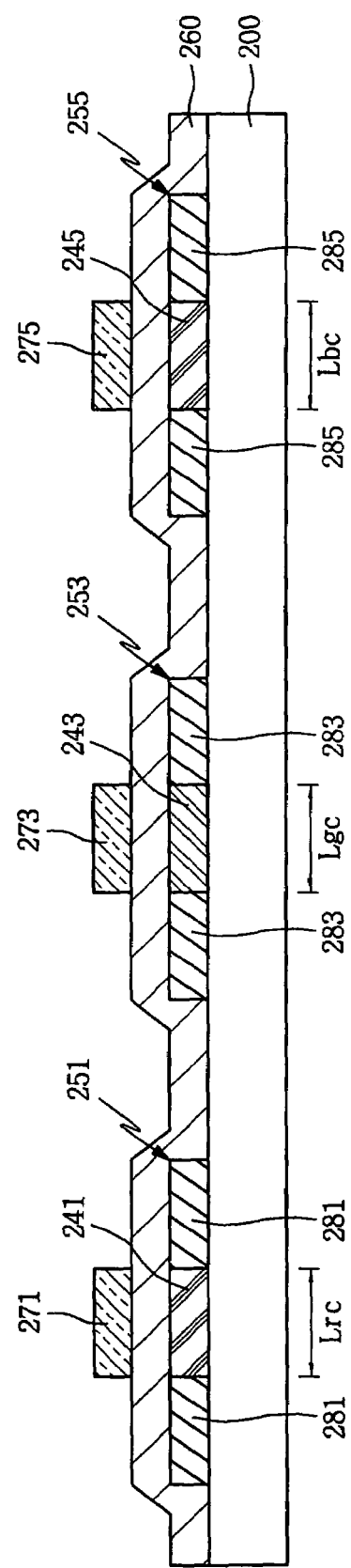

Referring to FIG. 2D, a gate insulating film 260 is formed on the substrate including the semiconductor layers 251, 253 and 255, and gates 271, 273 and 275 of the driving transistor of each unit pixel are formed on the gate insulating film 260. Source/drain regions 281, 283 and 285 of each driving transistor are formed by performing ion implantation of impurities of a desired conductivity type into the semiconductor layers 251, 253 and 255 using the gates 271, 273 and 275 as masks, respectively.

Even though it was not shown in the drawing, an interlayer insulating film may be formed on the entire surface of the substrate. Contact holes for exposing the source/drain regions 281, 283 and 285 may be formed by etching the interlayer insulating film and the gate insulating film 260, and source/drain regions electrically connected to the source/drain regions 281, 283 and 285 through the contact holes may be formed, thereby manufacturing the driving transistor.

In a flat panel display of the present invention manufactured using the method described above, the driving transistors of the R, G and B unit pixels may include channel layers having the same length Lrc, Lgc and Lbc. The driving transistors of the R and B unit pixels may include the channel layers made of the poly silicon films 241 and 245 crystallized by the MILC method, respectively, and the driving transistor of the G unit pixel may include the channel layer made of the poly silicon film 243 crystallized by the MIC method. Therefore, the driving transistors of the R, G and B unit pixels may have channel layers of the same size. Further, current mobilities of the channel layers may be changed in accordance with the crystallization directions of the channel layers of the driving transistors of the R, G and B unit pixels.

The channel layers of the driving transistors of the R and B unit pixels which have relatively low luminous efficiencies may be made of the poly silicon films 241 and 245 crystallized by the MILC method having high current mobility, and the channel layer of the driving transistor of the G unit pixel having a relatively high luminous efficiency may be made of the poly silicon film 243 crystallized by the MIC method having low current mobility.

Therefore, according to an embodiment of the invention, while a resistance value of the channel layer may be determined by changing the crystallization direction of the channel layer in accordance with the luminous efficiencies of the EL devices of the R, G and B unit pixels, the channel layers of the driving transistors of the R and B unit pixels having very low luminous efficiencies relatively are made of poly silicon films crystallized by the MILC method having a crystallization direction of the same direction with the channel length, that is, horizontal direction, and accordingly have relatively low resistance values. Also, the channel layer of the driving transistor of the G unit pixel having a relatively high luminous efficiency is made of the poly silicon film crystallized by the MIC method having a crystallization direction of a perpendicular direction to the channel length, that is, vertical direction and accordingly has relatively high resistance value.

Accordingly, the white balance of the present invention may be embodied by making sizes of the channel layers of the R, G and B unit pixels the same and making the crystallization directions of them different, and then making the current mobilities have different values from one another.

Figure 3:
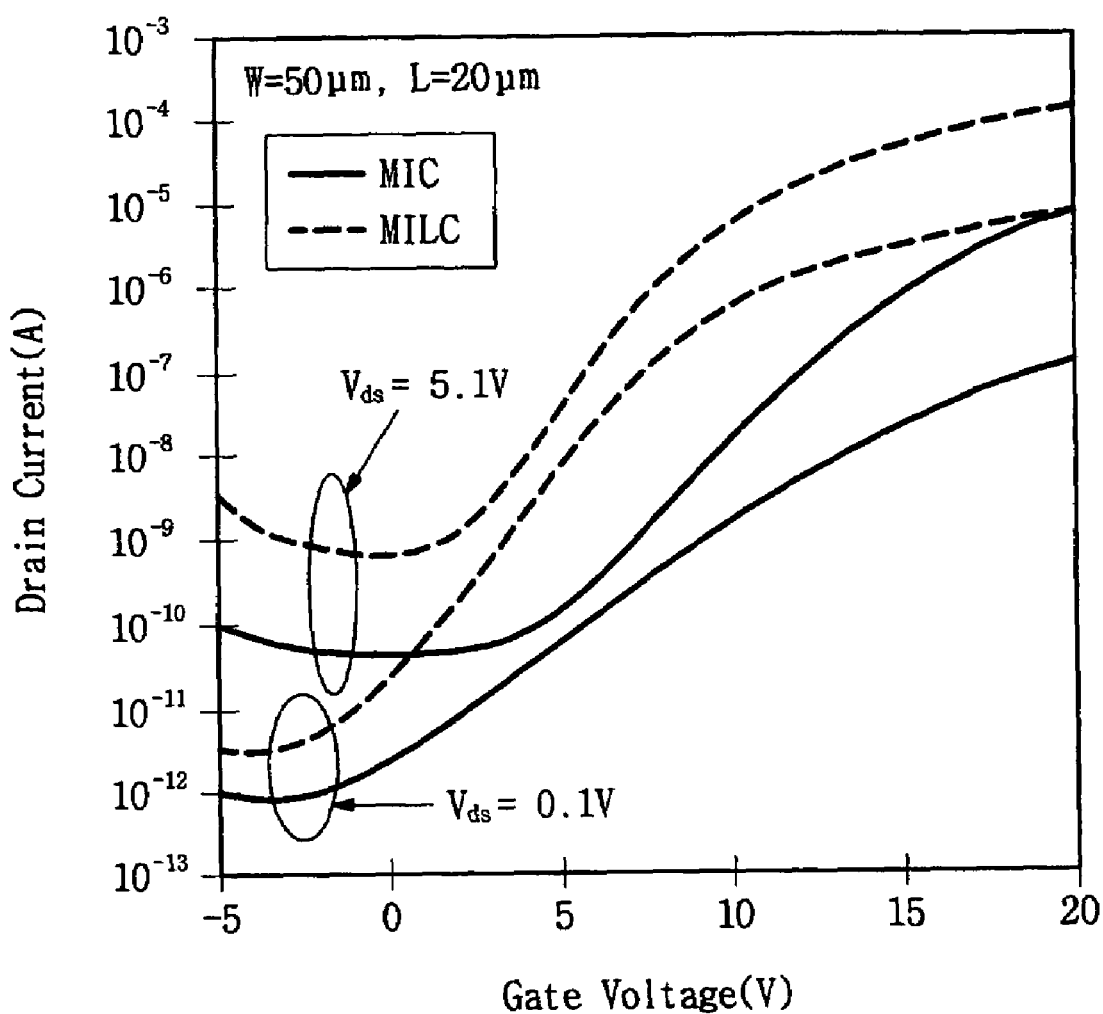
FIG. 3 is a view showing a relationship between a gate voltage and a drain voltage in accordance with MIC/MILC crystallization methods.

FIG. 3 is a view showing a relationship between a gate voltage and a drain voltage of thin film transistors including semiconductors layers crystallized by the MIC and MILC methods. FIG. 3 shows that even in the case of thin film transistors having the same sizes (W/L) and channel directions, current quantities can be different in accordance with the fine structure of the poly silicon film of the channel layer.

Referring to FIG. 3, it is noted that the drain current characteristic to the gate voltage of the MILC polycrystalline silicon thin film transistor is superior to that of the drain current characteristics to the gate voltage of the MIC poly silicon thin film transistor. Therefore, the current mobility of the thin film transistor made of the poly silicon film crystallized by the MILC method is higher than that of the thin film transistor made of the poly silicon film crystallized by the MIC method.

Accordingly, in one embodiment of the present invention, the channel layer of the driving transistor of the green unit pixel having a relatively high luminous efficiency is made of the MIC polycrystalline silicon film, and the channel layers of the driving transistors of the red and blue unit pixels having relatively low luminous efficiencies are made of the MILC polycrystalline silicon films. The white balance may be embodied by increasing the current flowing through the driving transistor of the red or blue unit pixel more than current flowing through the driving transistor of the green unit pixel.

In one embodiment of the present invention, even though the channel layers of the driving transistors are formed of polycrystalline silicon films crystallized by the MIC and/or MILC method in accordance with the luminous efficiencies of the R, G and B EL devices, this MIC and/or MILC method may be applied to the switching transistors of the R, G and B unit pixels. For example, all of channel layers of the switching transistors of the R, G and B unit pixels may be formed of the poly silicon film crystallized by the MILC and/or the MIC method. Alternatively, the switching transistor of the G unit pixel having high luminous efficiency may have the channel layer formed of the poly silicon film crystallized by the MIC method and the switching transistor of the R or B unit pixel having low luminous efficiency may have the channel layer formed of the poly silicon film crystallized by the MILC method. The semiconductor layers of the driving transistor and the switching transistors of the R, G and B unit pixels may have the same or different crystallization directions from the corresponding channel layer.

Even though the channel layer of one embodiment of the present invention is described as crystallized by the MIC/MILC, channel layers of the driving transistors of the R, G and B unit pixels may have different crystallization methods from one another so that all crystallization methods having different current mobilities from one another may be applicable to the present invention.

FIGS. 4A, 4B, 4C and 4D are sectional views of process showing a method for manufacturing driving transistors of R, G and B unit pixels in accordance with another embodiment of the present invention. Sectional structures of FIGS. 4A, 4B, 4C and 4D illustrate to the driving transistors of the R, G and B unit pixels of each pixel in the organic light emitting diode.

Figure 4A:
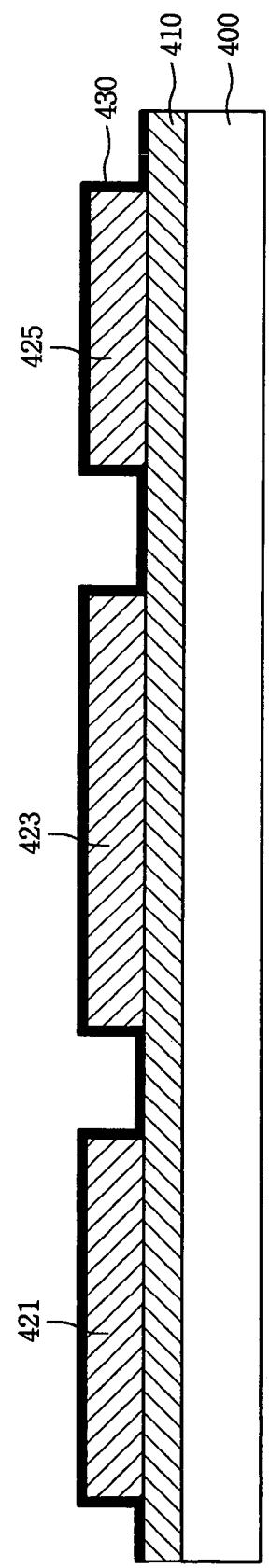
FIGS. 4A, 4B, 4C and 4D are sectional views of a method for manufacturing driving transistors of R, G and B unit pixels in accordance with another embodiment of the present invention.

Referring to FIG. 4A, even though it was not shown in the drawing, a buffer layer is formed on an insulating substrate 400 and an amorphous silicon layer 410 is formed on the substrate. A number of masks 421, 423 and 425 for MILC are formed on the amorphous silicon layer 410 and a metal layer 430 is formed on the entire surface of the substrate.

The masks 421, 423 and 425 for MILC are formed with different widths from one another, wherein the order of the mask width from the top is a second mask 423, a first mask 421 and a third mask 425. The first mask 421 is formed on a region where the driving transistor (113 in FIG. 1) of an R unit pixel among the R, G and B unit pixels is to be formed correspondingly, the second mask 423 is formed on a region where the driving transistor (123 in FIG. 1) of a G unit pixel is to be formed. The third mask 425 is formed on a region where the driving transistor (133 in FIG. 1) of a B unit pixel is to be formed.

Figure 4B:
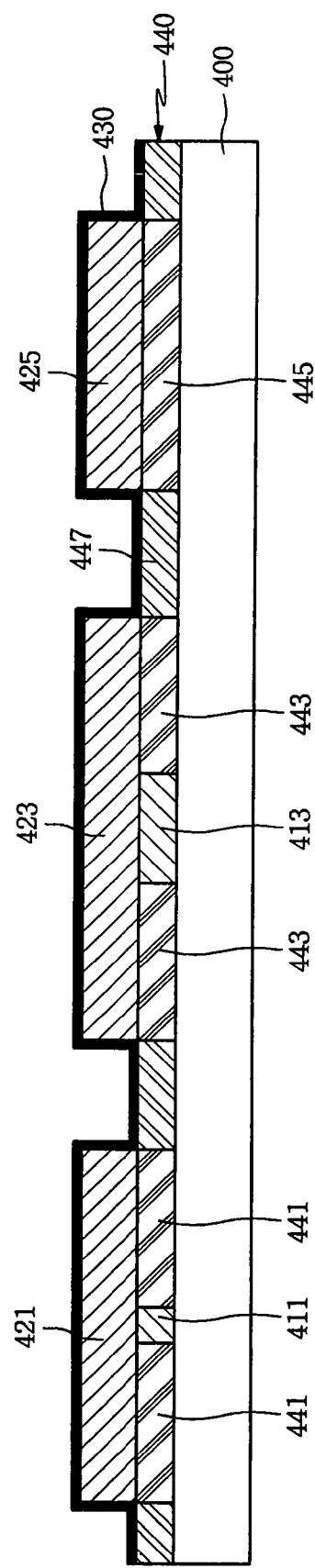

Referring to FIG. 4B, a crystallization process to crystallize the amorphous silicon film 410 to a polycrystalline silicon film 440 is performed, wherein portions corresponding to the masks 421, 423 and 425 among the amorphous silicon film 410 are crystallized into polycrystalline silicon films 441, 443 and 445 by the MILC method. A portion directly contacted with the metal layer 430 between the masks 421, 423 and 425 is crystallized into a polycrystalline silicon film 447 by the MIC method.

Since the first to third masks 421, 423 and 425 for MILC have different widths from one another, a portion of the poly silicon film 440 corresponding to the third mask 425 having a relatively low width is crystallized by the MILC method and portions corresponding to the first and second masks 421 and 423 having a relatively high widths are partially crystallized by the MILC leaving the amorphous silicon films 411 and 413 intact, respectively.

That is, the amorphous silicon film 411 exists between portions 441 crystallized by the MILC method among the polycrystalline silicon film 440 corresponding to the first mask 421. Further, the amorphous silicon film 413 exists between the portions 443 crystallized by the MILC method among the polycrystalline silicon film 440 corresponding to the second mask. Since the width of the first mask 421 is relatively smaller than the width of the second mask 423, the length of the amorphous silicon film 413 corresponding to the second mask 423 is larger than the length of the amorphous silicon film 411 corresponding to the first mask 421.

Figure 4C:
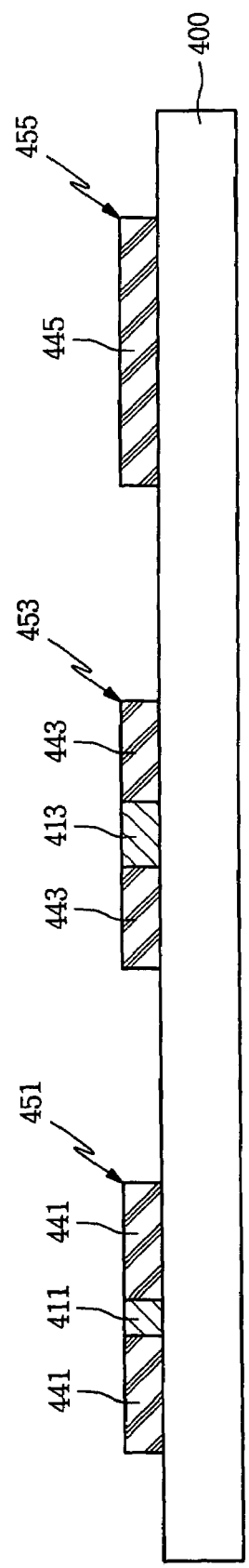

Referring to FIG. 4C, after removing the masks 421, 423 and 425 used for the MILC method and the metal layer 430, semiconductor layers 451, 453 and 455 for the driving transistors of the R, G and B unit pixels are formed by patterning the polycrystalline silicon film 440 using a mask (not shown in the drawing) for forming the semiconductor layer. The semiconductor layer 451 for the driving transistor of the R unit pixel among the R, G and B unit pixels is formed of the portions 441 crystallized by the MILC method among the polycrystalline silicon films 440 and the amorphous silicon film 411 existing between the portions 441. The semiconductor layer 453 for the driving transistor of the G unit pixel is formed of the portions 443 crystallized by the MILC method among the polycrystalline silicon films 440 and the amorphous silicon film 413 existing between the portions 443. On the other hand, the semiconductor layer 455 for the driving transistor of the B unit pixel is formed of the polycrystalline silicon film 445 only crystallized by the MILC method among the polycrystalline silicon films.

Figure 4D:
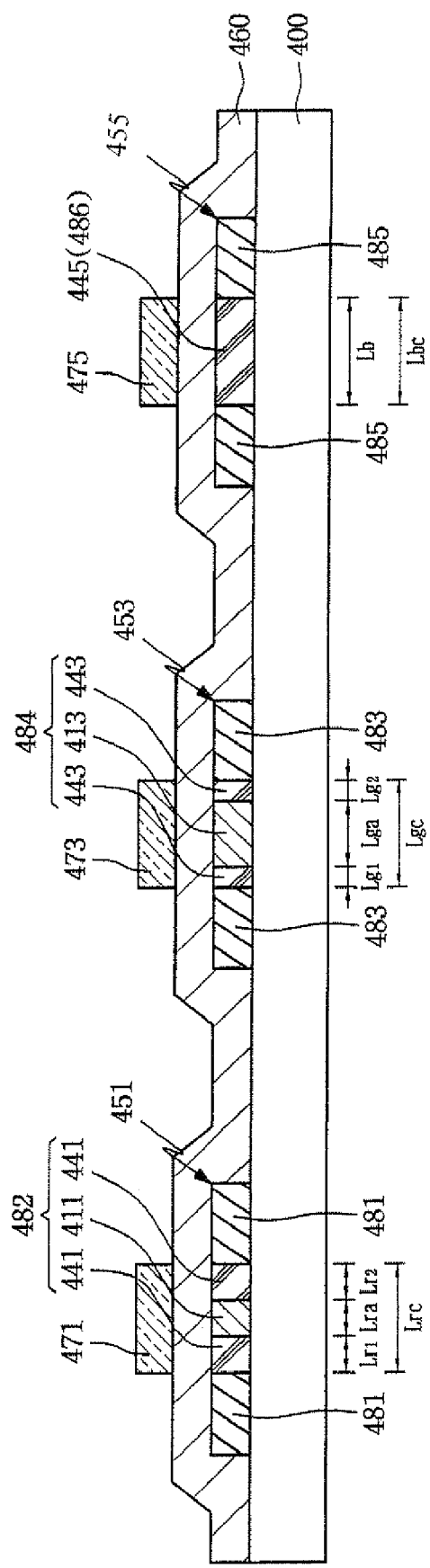

Referring to FIG. 4D, a gate insulating film 460 is deposited on the entire surface of the substrate, including the semiconductor layers 451, 453 and 455. A conductive material, such as a metal film, is deposited on the film 460 and then gates 471, 473 and 475 of the driving transistors of each of the R, G and B unit pixels are formed by patterning the conductivity material using a mask (not shown in the drawing) for forming the gate. Then, source/drain regions 481, 483 and 485 of the driving transistors are formed by performing an ion implantation into the semiconductor layers 451, 453 and 455 with high concentration impurities of desired conductive type using the gates 471, 473 and 475 as masks.

Even though it was not shown in the drawing, the driving transistor may be manufactured by forming an interlayer insulating film on the entire surface of the substrate, forming contact holes for exposing the source/drain regions 481, 483 and 485 by etching the interlayer insulating film and the gate insulating film 460, and forming source/drain electrodes electrically connected to the source/drain regions 481, 483 and 485 through the contact holes.

In a flat panel display in accordance with the present invention manufactured by the method described above, a channel layer 482 of the driving transistor of the R unit pixel may be made of the polycrystalline silicon film 441 crystallized by the MILC method and the amorphous silicon film 411. The length Lrc of the channel layer becomes the sum of lengths Lr1 and Lr2 of the polycrystalline silicon film 441 and the length Lra of the amorphous silicon film 411, that is, Lrc=Lr1+Lra+Lr2. A channel layer 484 of the driving transistor of the G unit pixel is made of the polycrystalline silicon film 443 crystallized by the MILC method and the amorphous silicon film 413. The length Lgc of the channel layer becomes the sum of lengths Lg1 and Lg2 of the polycrystalline silicon film 443 and the length Lga of the amorphous silicon film 413, that is, Lgc=Lg1+Lga+Lg2. A channel layer 486 of the driving transistor of the B unit pixel is made of the polycrystalline silicon film 445 only crystallized by the MILC method, and the length Lbc of the channel layer is identical with the length Lb of the polycrystalline silicon film 445.

In the driving transistors of each of the R, G and B unit pixels, since the lengths of the channel layers 482, 484 and 486 are same as Lrc=Lgc=Lbc, the resistance values of the channel layers of the driving transistors are changed in accordance with lengths of the amorphous silicon films included in each channel layer. While embodiments of the present invention may be constructed to determine the resistance values of the channel layers in accordance with the luminous efficiencies of the EL devices of the R, G and B unit pixels, since the channel layer 486 of the B unit pixel having the lowest luminous efficiency relatively is made of the polycrystalline silicon film crystallized by the MILC method, the resistance value of the channel layer is relatively low.

Also, the channel layer 282 or 284 of the R or G unit pixel having a relatively high luminous efficiency includes an amorphous silicon film between the polycrystalline silicon films so that the resistance value of the channel layer is increased relatively. Since the EL device of the R unit pixel has a luminous efficiency lower than that of the EL device of the G unit pixel, the length Lra of the amorphous silicon film 411 existing in the channel layer 482 of the R unit pixel is formed to be shorter than the length Lga of the amorphous silicon film 413 existing in the channel layer 484 of the G unit pixel, relatively.

Accordingly, while the lengths of the channel layers of the driving transistors of the R, G and B unit pixels in accordance with another embodiment of the present invention are formed to be same, the amorphous silicon films existing in the channel layers of the driving transistors of the R, G and B unit pixels are formed to have different lengths from one another. Therefore, the white balance can be embodied by making the resistance values of the channel layers of the driving transistors different from one another.

In accordance with another embodiment of the present invention, the resistance values of the channel layers of the driving transistors of the R, G and B unit pixels are changed by performing the crystallization process in order that the amorphous silicon film exists among the channel layers through the MILC process. However, methods for changing resistance values of the driving transistors of the R, G and B unit pixels may be applicable to the present invention by making the channel layer include the amorphous silicon films having different lengths from one another using other crystallization process instead of the MILC process. Even though there may be no amorphous silicon film in the channel layer of the driving transistor of the B unit pixel, the present invention is not restricted to the construction described above. Rather, the present invention can be formed even with a construction including an amorphous silicon film having a resistance value in a level capable of embodying the white balance to the channel layer of the R or G unit pixel.

In accordance with another embodiment of the present invention, a crystallization process can be performed so that an amorphous silicon film exists in each channel layer by controlling a crystallization temperature or a crystallization time when performing MILC crystallization. It is possible that all channel regions of the switching transistors of the unit pixels may be formed of the MILC polycrystalline silicon film. The driving transistors of the R and G unit pixels have an amorphous silicon film between the polycrystalline silicon films and the driving transistor of the B unit pixel may have a channel region made of a polycrystalline silicon film.

In The present invention described above, achieves the white balance without increasing the pixel area but by changing current mobilities or resistance values of the channel layers of the R, G and B unit pixels.

Also, the present invention may reduce processing costs and simplifying the process by crystallizing the amorphous silicon film into the polycrystalline silicon film using the MIC/MILC crystallization methods and then forming semiconductor layers of the driving transistors of the R, G and B unit pixels having different current mobilities.

Although the preferred embodiments of the present invention have been disclosed for illustrative purposes, those skilled in the art appreciate that various modifications, additions and substitutions are possible, without departing from the scope and spirit of the invention as disclosed in the accompanying claims.

What is claimed is:

1. A flat panel display, comprising:
a plurality of pixels, each of the pixels including R, G and B unit pixels to embody red (R), green (G) and blue (B) colors, respectively, and each of the unit pixels including at least one transistor,
wherein transistors of at least two unit pixels of the R, G, and B unit pixels include channel layers with different current mobilities.

2. The flat panel display according to claim 1, wherein each of the at least one transistor in the R, G and B unit pixels includes a channel layer having the same size in each pixel.

3. The fiat panel display according to claim 1, wherein the R, G and B unit pixels each further include a light-emitting device, and transistors to control currents supplied to the light-emitting devices of each unit pixel include the channel layers having the same size in each pixel.

4. The flat panel display according to claim 1, wherein the R, G and B unit pixels further include a light-emitting device driven by at least one transistor, where current mobility of a transistor to drive a light-emitting device having the highest luminous efficiency among the lighting-emitting devices of the unit pixels is lower than the current mobility of at least one transistors to drive lighting-emitting devices having a relatively low luminous efficiency.

5. The flat panel display according to claim 1, wherein the channel layers of the transistors of the R, G and B unit pixels are made of polycrystalline silicon films having different crystallization directions from one another.

6. The flat panel display according to claim 5, wherein the R, G and B unit pixels each further include a light-emitting devices driven by the transistors, respectively, where a channel layer of a transistor to drive a light-emitting device having the highest luminous efficiency among the light-emitting devices is made of a metal induced crystallization (MIC) polycrystalline silicon film, and channel layers of transistors to drive light-emitting devices having relatively low luminous efficiency are made of a metal induced lateral crystallization (MILC) polycrystalline silicon film.

7. The flat panel display according to claim 1, wherein the R, G and B unit pixels each further include a light-emitting device driven by the transistors, respectively, and the R, G and B unit pixels each includes a driving transistor to drive the light emitting device and a switching transistor to the driving transistor switch on or off.

8. The flat panel display according to claim 7, wherein the channel layers of the switching transistors of the R, G and B unit pixels are made of a MIC polycrystalline silicon film, and wherein a driving transistor of a unit pixel having the highest luminous efficiency among the R, G and B unit pixels has a channel layer made of the MIC polycrystalline silicon film and driving transistors of unit pixels having a relatively lower luminous efficiency have channel layers made of a MILC polycrystalline silicon film.

9. The fiat panel display according to claim 7, wherein the channel layers of the switching transistors of the R, G and B unit pixels are made of a MILC polycrystalline silicon film, and wherein a driving transistor of a unit pixel having the highest luminous efficiency among the R, G and B unit pixels has a channel layer made of a MIC polycrystalline silicon film and driving transistors of unit pixels having a relatively lower luminous efficiency have channel layers made of the MILC polycrystalline silicon film.

10. The flat panel display according to claim 7, wherein a switching transistor and a driving transistor of a unit pixel having the highest luminous efficiency among the R, G and B unit pixels have channel layers made of a MIC polycrystalline silicon film, and driving transistors and switching transistors of unit pixels having a relatively lower luminous efficiency have channel layers made of a MILC polycrystalline silicon film.

11. A flat panel display, comprising a plurality of pixels, each of the pixels including R, G and B unit pixels to embody red (R), green (G) and blue (B) colors, respectively, and each of the unit pixels including a transistor,
wherein the transistor of at least one unit pixel among the R, G, B unit pixels includes a channel layer made of silicon layers having different current mobilities.

12. The flat panel display according to claim 11, wherein the transistors of at least two unit pixels among the R, G and B unit pixels include channel layers made of silicon layers of at least one different current mobility, and wherein a length of a first silicon layer having low current mobility and a length of a second silicon layer having low current mobility are different.

13. The flat panel display according to claim 11, wherein the transistors of the R, G and B unit pixels include channel layers having a same length.

14. The flat panel display according to claim 11, wherein the R, G and B unit pixels each further include a light-emitting device, and transistors to control currents supplied to the light-emitting devices of the unit pixels include channel layers having a same length.

15. The flat panel display according to claim 14, wherein a channel layer of a transistor corresponding to a light-emitting device having the lowest luminous efficiency among the light-emitting devices of the R, G and B unit pixels does not include a silicon layer having low current mobility or includes a silicon layer having low current mobility with a smaller length than channel layers of transistors corresponding to light-emitting devices having relatively higher luminous efficiency.

16. The flat panel display according to claim 13, wherein the channel layer is made of a polycrystalline silicon layer and an amorphous silicon layer.

17. The flat panel display according to claim 13, wherein a silicon layer having low current mobility in the channel layer is made of an amorphous silicon layer.

* * * * *